United States Patent [19]

Jordan et al.

[11] 4,265,933
[45] May 5, 1981

[54] PHOTOVOLTAIC CELL

[75] Inventors: John P. Jordan, El Paso, Tex.; Curtis Lampkin, Cincinnati, Ohio

[73] Assignee: Photon Power, Inc., El Paso, Tex.

[21] Appl. No.: 835,515

[22] Filed: Sep. 22, 1977

Related U.S. Application Data

[63] Continuation of Ser. No. 645,461, Dec. 30, 1975, abandoned.

[51] Int. Cl.³ .............................................. B05D 3/06
[52] U.S. Cl. ................................... 427/54.1; 427/74
[58] Field of Search ............... 427/74, 54; 136/89 TF, 136/89 CD

[56] References Cited

U.S. PATENT DOCUMENTS

| | | | |
|---|---|---|---|
| 2,522,531 | 9/1950 | Mochel | 427/109 |
| 3,048,502 | 8/1962 | Nicholson | 427/74 |
| 3,148,084 | 9/1964 | Hill et al. | 427/74 |
| 3,530,053 | 9/1970 | Scott | 427/53 |
| 3,902,920 | 8/1975 | Jordan | 136/89 TF |

Primary Examiner—James R. Hoffman
Attorney, Agent, or Firm—Bard & Groves

[57] ABSTRACT

A large area photovoltaic cell comprising a layer of polycrystalline cadmium sulfide, about 1 to 2 microns thick, formed by simultaneously spraying two suitably selected compounds on a uniformly heated plate of Mesa glass and irradiating the layer of polycrystalline cadmium sulfide with intense ultra-violet light during the spraying.

2 Claims, 3 Drawing Figures

PHOTOVOLTAIC CELL

This is a continuation, of application Ser. No. 645,461, filed Dec. 30, 1975 and now abandoned.

BACKGROUND

In the art of making micro-crystal cadmium sulfide voltaic cells it has been the practice to fabricate the cadmium sulfide layer of considerable thickness, say 20 microns. This has been deemed necessary to assure that pin holes, or other types of defects, do not occur in the layer which, if present, render the cell inoperative. It has heretofore been considered unfeasible to utilize extremely thin layers of cadmium sulfide because a large proportion of the cells prove defective in practice. It is one purpose of the present invention to provide a large area photo-voltaic cell capable of being incorporated in a system employing areas of photo-voltaic generators covering areas of the order of square miles, to enable large scale production of electric power. In such systems the total quantity of cadmium required becomes a problem, since cadmium is in short supply in the United States and is expensive. Reduction of the feasible thickness of cadmium compound required to fabricate a given area of cell is therefore crucial economically, and a reduction of thickness of CdS layer by an order of magnitude or more renders economically feasible a large scale power generator of the photo-voltaic type, which otherwise is not economically feasible. Utilization of minimum cadmium per unit area of cell is rendered feasible by utilization of a rectifying like positive electrode in the cell and by irradiating the cadmium sulfide layer during the formation process with intense ultra-violet light.

It is, accordingly, a primary object of the present invention to provide a photovoltaic cell which utilizes minimum weight of cadmium per unit area and which can therefore be economically utilized as a power source in a large scale electrical power generation system. This same objective is subserved by providing a cell which has only coplanar electrodes, and also in terms of time required to fabricate a given area of cell, a twenty micron layer requiring twenty times as much spray time as does a one micron layer, in forming the requisite cadmium sulfide microcrystalline layer on a substrate.

In the U.S. Pat. No. to Hill et al 3,148,084, issued Sept. 8, 1964, a method is taught for forming a layer of cadmium sulfide microcrystals on a glass substrate. Essentially, the method involves spraying the glass substrate, while the layer is hot, with a cadmium salt-thiourea complex, i.e., cadmium chloride plus a thiourea, in suitable proportions. The teaching of the patent is that the glass may be heated by means of a hot plate, and that the spraying may take place in the atmosphere. Whe have found that precisely uniform temperature of the glass plate is essential and that a hot plate is not able to heat a glass plate uniformly because the hot plate and the glass plate do not make perfect contact throughout, and that even slight non-uniformities of temperature of the glass substrate produce anomalous areas of the layer of CdS, which can render an entire photovoltaic cell inoperative. The layer of CdS must grow in the form of many tiny crystals, the axes of which are predominantly parallel. Application of the sprayed materials at a uniform, and sufficiently slow rate, is important, as is uniformity of temperature, to assure uniformity of crystal growth rate and of orientation over the entire glass plate. We have found that application of very intense ultraviolet light over the entire CdS microcrystalline layer, as it grows, to enhance uniformity and orientation of crystal growth improves the end produce, as evidenced by the fact that the percentage of plates which prove imperfect is reduced. The layer of CdS may be only about 1.0 to 2.0 microns thick, in the process of the present invention, which is contrary to prior art practice.

SUMMARY

A method of forming a film comprising cadmium sulfide crystals, such as utilized in a photovoltaic cell, of the type including a layer of tin oxide on a glass base, a layer of uniformly oriented cadmium sulfide microcrystals on the film of tin oxide, including the step of irradiating the film of cadmium sulfide crystals with intense ultra-violet light during the formation process. The CdS may be deposited by successively spraying respectively a cadmium salt-thiourea complex thiourea complex while the glass is floating in a molten metal bath of suitable temperature, allowing CdS micro-crystals to develop only on contact of such solution with a suitable heated surface.

DETAILED DESCRIPTION

Figure 2:
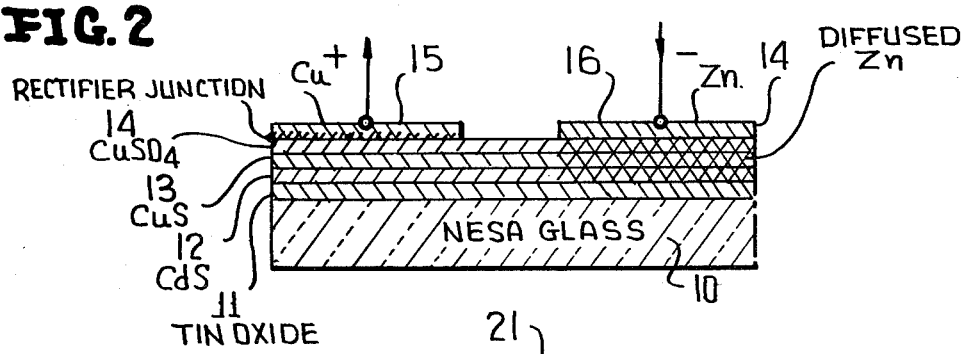
FIG. 2 is a view in section taken on line 2—2 of FIG. 1.

In FIG. 2, 10 is a plate of Nesa glass, i.e., non-conductive glass having on one of its surfaces a thin layer 11 of tin oxide, which is conductive. Overlying the layer 11 of tin oxide is a layer 12 of polycrystalline CdS formed by a novel process according to the present invention. Overlying the layer 12 of CdS is a further layer 13 of CuS. Overlying the CdS is a thin layer 14 of CuSO4, on which are depostied positive and negative electrodes 15, 16, of Cu and Zn respectively.

Figure 1:
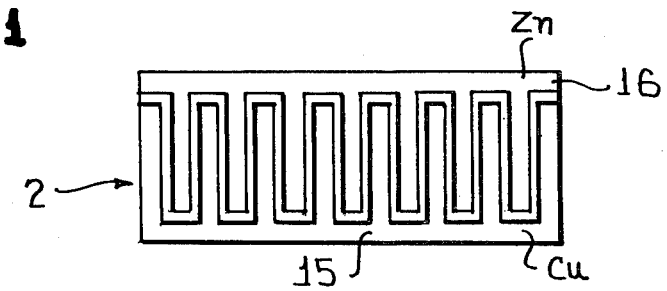
FIG. 1 is a view in plan of a photovoltaic cell according to the invention, showing interdigitated coplanar electrodes.

The CdS and CuS layers, at their interface, form a voltage generating heterojunction, the CuS being positive and CdS being negative, when the CdS is illuminated by light of the proper wavelength. Specifically, the cell is responsive to sunlight. The voltage generated at the heterojunction between the micro-crystalline CdS and the CuS is communicated via the CuSO4 layer to the Cu electrode 15. FIG. 1 depicts interdigitated electrodes 15 and 16, which may give the cell higher efficiency, as described in Jordan et al, U.S. Pat. No. 3,902,920.

Figure 3:
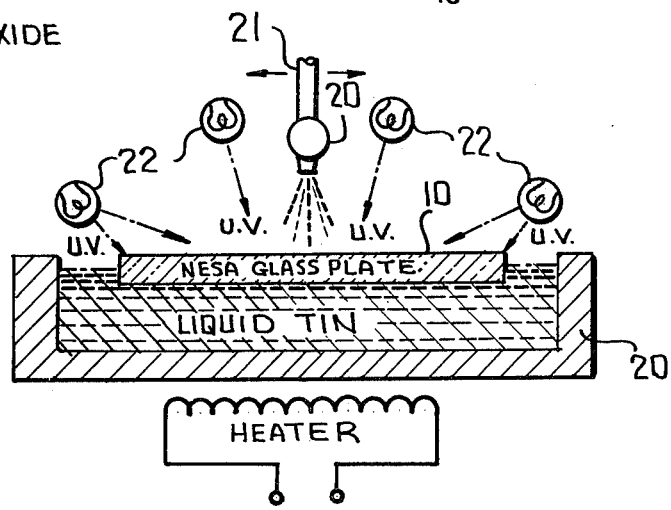
FIG. 3 is a view in section showing the mode of processing a glass plate to form a CdS micro-crystalline layer according to the invention.

The Hill et al patent, supra, teaches that the glass plate which forms a substrate in the present system must be bc2, about 700° F., while being sprayed, and that the spraying must be sufficiently slow to permit uniform growth rates for the CdS micro-crystals of the layer. It has been found that any non-uniformities of temperature of the glass plate, producing temperature gradients along the surface of the plate, result in imperfect crystal growth, and therefore a defective cell. To avoid this contingency, the glass plate 10 is sprayed, according to FIG. 3, while the plate 10 is floating in a bath 20 of molten metal, specifically tin. The glass plate 10 is not wet by the tin, so that when the glass plate 10 is removed from the molten tin bath, after it is sprayed, the underside of the plate is clean, or easily cleaned. The spray is provided via an oscillating nozzle 21, which repeatedly re-traces a planar path designed uniformly to cover the plate 10 with spray. The spray is a true water solution of cadmium chloride and thiourea. As the fine droplets of the spray contact the hot surface of the glass plate 10, the water is heated to vaporization and the dissolved material is deposited on the plate, forming CdS, plus volatile materials, and the CdS, if it has nucleating areas available, grows as small crystals. The nucleating areas are provided by the tin oxide, and if the spray is sufficiently uniform and sufficiently slow, and if the temperature of the glass surface is adequately high and uniform, crystal growth is uniform and all the crystals have nearly the same spatial inclinations, so that a uniform layer of nearly identical micro-crystals exists. It has been found that irradiating the crystals, as they grow, with high intensity ultra-violet light, from sources 22, assists in the crystal growing process and improves the quality of the cadmium sulfide crystals.

While one specific embodiment has been provided involving a CdS-CuS heterolayer, the feature of the invention relating to irradiation by ultraviolet light while the microcrystals are being formed ultimable with any form of microcrystalline heterojunction.

What is claimed is:

1. A method of enhancing the growth of CdS microcrystals, comprising the step of uniformly heating a nucleating substrate to a temperature effective to promote CdS crystal growth in a layer of microcrystalline CdS on said substrate, and irradiating said layer of microcyrstalline CdS with high intensity ultra-violet light during said heating to improve uniformity of crystal axis orientation during said CdS crystal growth.

2. A method according to claim 1, wherein said CdS layer is grown to a thickness of 1.0 to 2.0 microns.

* * * * *

UNITED STATES PATENT AND TRADEMARK OFFICE
CERTIFICATE OF CORRECTION

PATENT NO. : 4,265,933

DATED : May 5, 1981

INVENTOR(S) : John F. Jordan and Curtis M. Lampkin

It is certified that error appears in the above-identified patent and that said Letters Patent are hereby corrected as shown below:

Abstract Line 5, change "Mesa glass" to --Nesa glass--.

Col. 1, l. 57, change "Whe" to --We--.

Col. 2, l. 31, omit second "thiourea complex".

Col. 2, l. 60, change "bc2" to --hot--.

Col. 4, l. 6, change "ultimable" to --is utilizable--.

Signed and Sealed this

Fourth Day of August 1981

[SEAL]

Attest:

GERALD J. MOSSINGHOFF

Attesting Officer     Commissioner of Patents and Trademarks